(12) United States Patent
Adusumilli et al.

(10) Patent No.: US 10,109,740 B2
(45) Date of Patent: Oct. 23, 2018

(54) PROGRAMMABLE BULK FINFET ANTIFUSES

(71) Applicant: INTERNATIONAL BUSINESS MACHINES CORPORATION, Armonk, NY (US)

(72) Inventors: Praneet Adusumilli, Albany, NY (US); Alexander Reznicek, Troy, NY (US); Oscar van der Straten, Guilderland Center, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/212,824

(22) Filed: Jul. 18, 2016

(65) Prior Publication Data

US 2018/0019340 A1    Jan. 18, 2018

(51) Int. Cl.
*H01L 29/78*    (2006.01)
*H01L 23/525*   (2006.01)
*H01L 29/06*    (2006.01)
*H01L 29/423*   (2006.01)
*H01L 29/66*    (2006.01)

(52) U.S. Cl.
CPC ...... *H01L 29/7851* (2013.01); *H01L 23/5252* (2013.01); *H01L 29/0638* (2013.01); *H01L 29/0653* (2013.01); *H01L 29/42372* (2013.01); *H01L 29/66795* (2013.01); *H01L 29/785* (2013.01)

(58) Field of Classification Search
CPC ............. H01L 29/7851; H01L 23/5252; H01L 29/0638; H01L 29/0653; H01L 29/42372; H01L 29/66795; H01L 29/785

USPC ......................................................... 257/401
See application file for complete search history.

(56) References Cited

U.S. PATENT DOCUMENTS

| | | | | |
|---|---|---|---|---|
| 4,764,480 A | * | 8/1988 | Vora | H01L 21/8249 257/370 |
| 5,282,158 A | * | 1/1994 | Lee | H01L 23/5252 257/529 |
| 5,489,792 A | * | 2/1996 | Hu | H01L 29/42384 257/347 |
| 6,928,021 B2 | | 8/2005 | Pecheyran et al. | |
| 7,060,571 B1 | * | 6/2006 | Ngo | H01L 21/28079 257/E21.202 |
| 7,087,499 B2 | | 8/2006 | Rankin et al. | |
| 8,891,328 B2 | | 11/2014 | Li | |
| 9,058,999 B2 | | 6/2015 | Li | |

(Continued)

FOREIGN PATENT DOCUMENTS

CN    103456711 B    3/2016

*Primary Examiner* — Marc Armand
*Assistant Examiner* — Sue Tang
(74) *Attorney, Agent, or Firm* — Tutunjian & Bitetto, P.C.; Daniel P. Morris

(57) ABSTRACT

An antifuse device includes a gate structure formed on a substrate including first spacers formed in an upper portion and a conductive material formed in a lower portion below the first spacers. Two conductive regions are disposed adjacent to the gate structure and on opposite sides of the gate structure. A dielectric barrier is formed between the conductive material and each of the conductive regions such that a dual antifuse is formed across the dielectric barrier between the conductive material and the conductive regions on each side of the gate structure.

19 Claims, 14 Drawing Sheets

(56) References Cited

U.S. PATENT DOCUMENTS

| | | | |
|---|---|---|---|
| 9,159,734 B2 | 10/2015 | Hafez et al. | |
| 2005/0285153 A1* | 12/2005 | Weis | H01L 27/10876 257/232 |
| 2006/0046354 A1* | 3/2006 | Kreipl | H01L 27/112 438/132 |
| 2014/0191339 A1* | 7/2014 | Hong | H01L 29/401 257/411 |
| 2015/0236154 A1* | 8/2015 | Park | H01L 29/4236 257/331 |
| 2016/0035735 A1 | 2/2016 | Hafez et al. | |

* cited by examiner

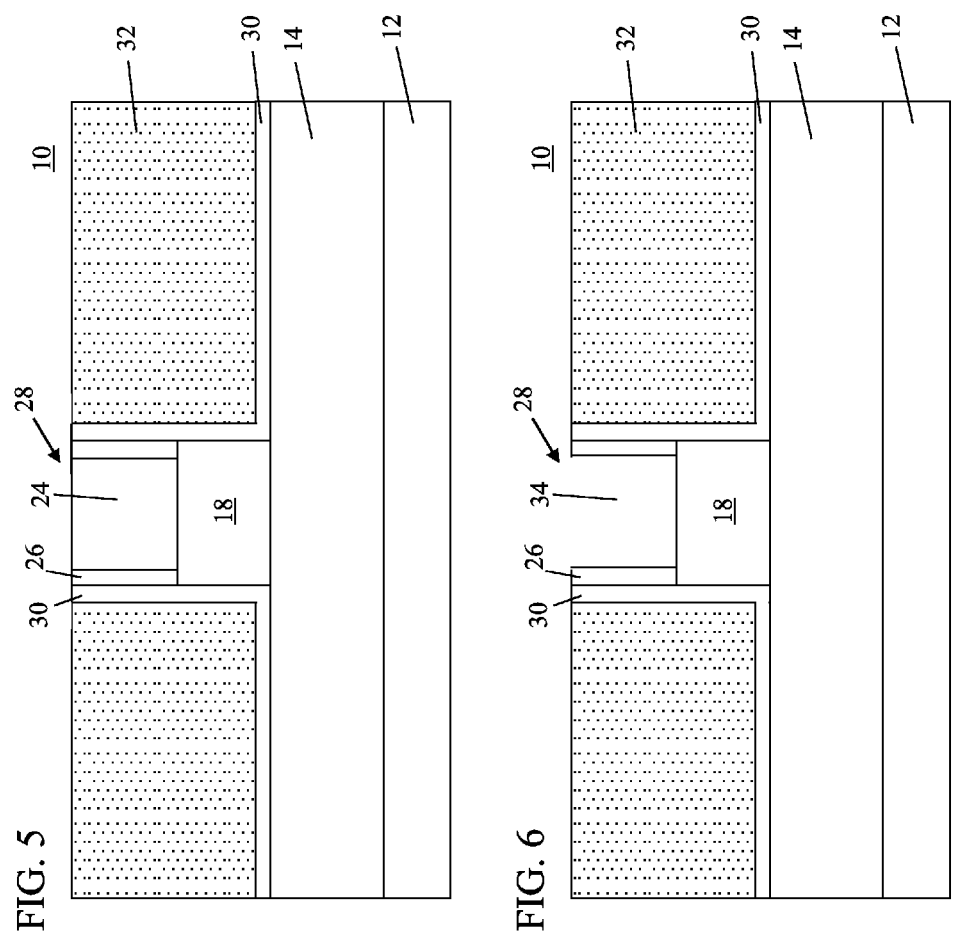

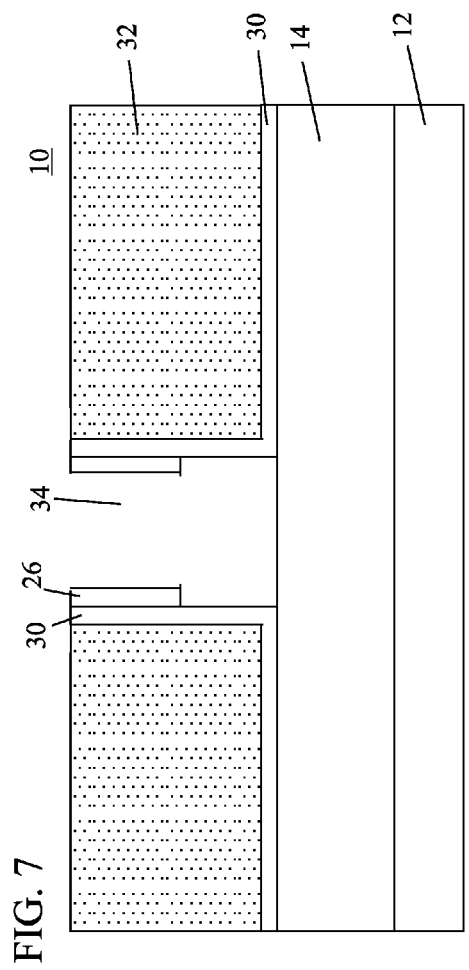
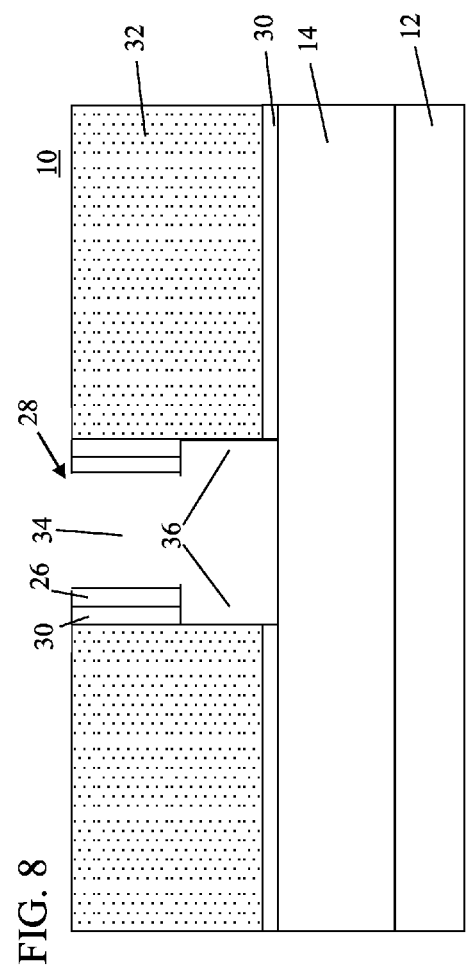

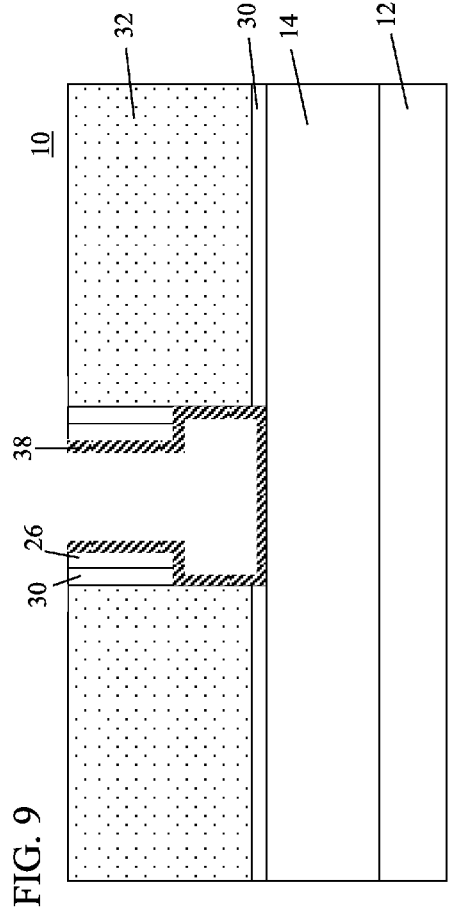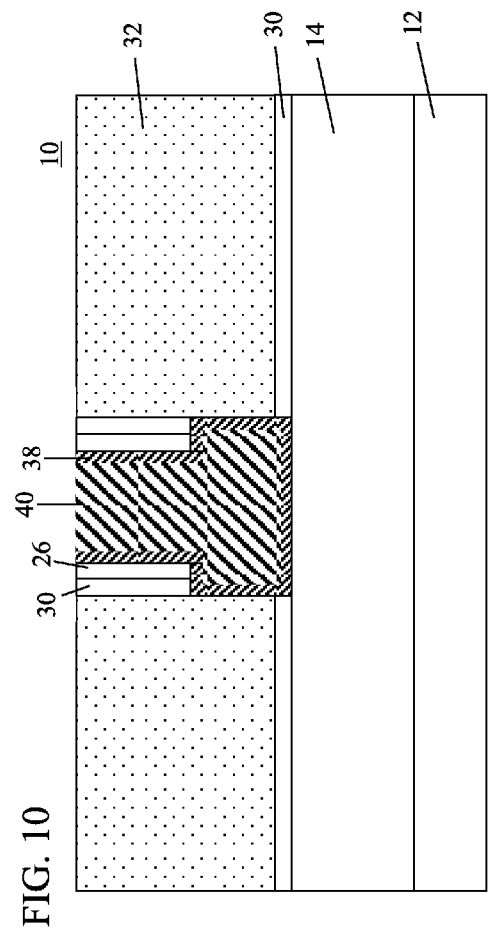
FIG. 9
FIG. 10

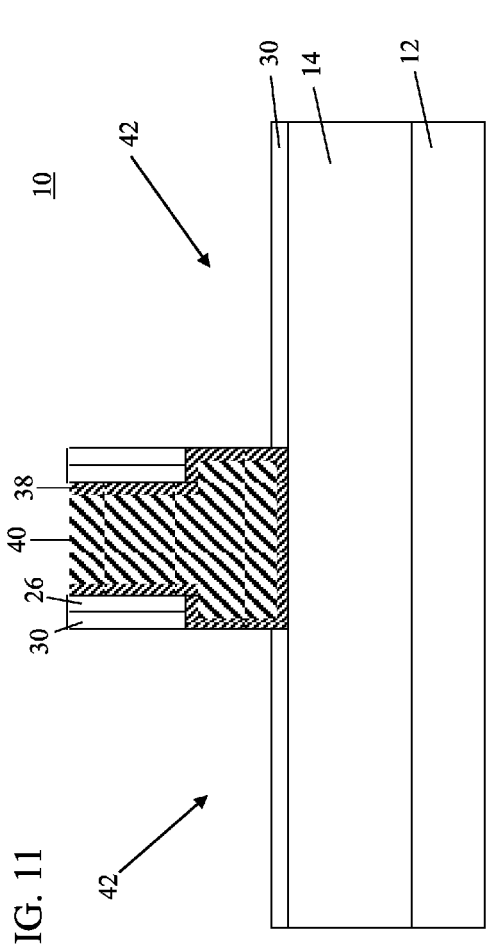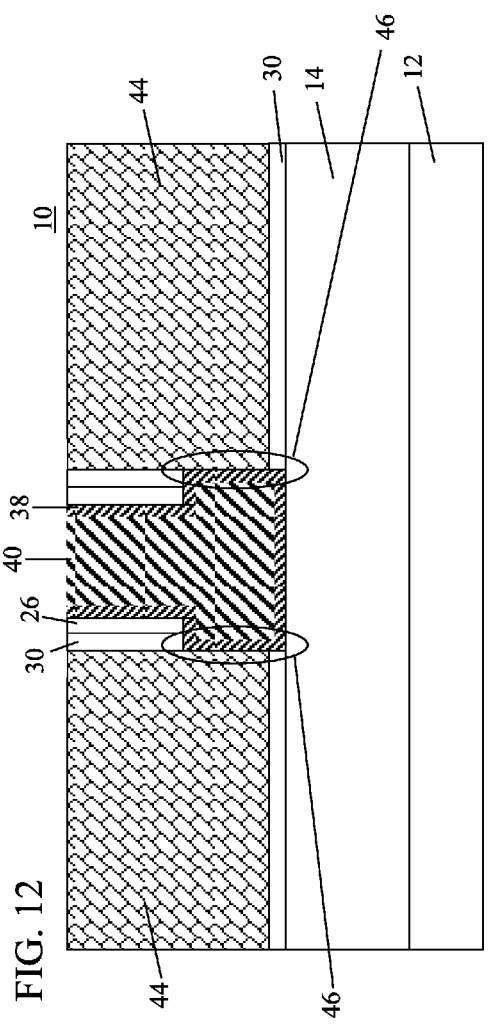

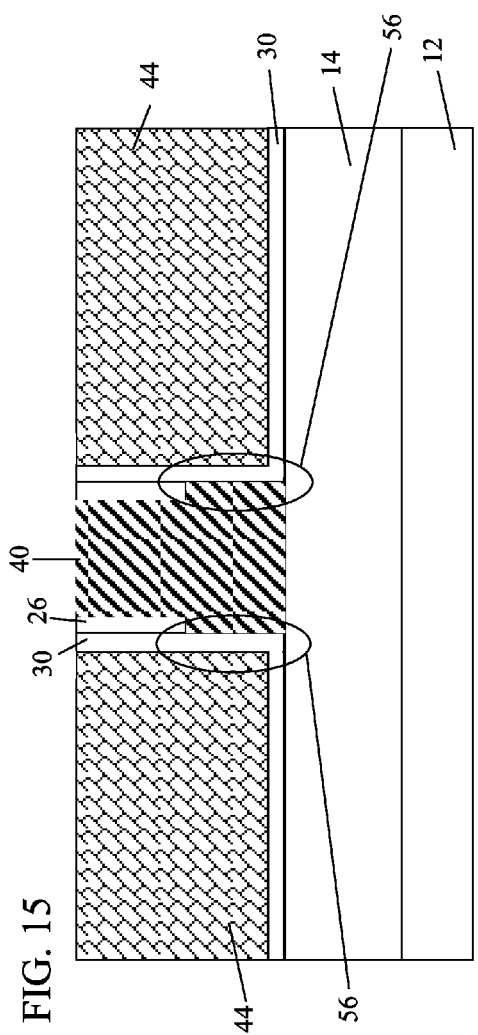
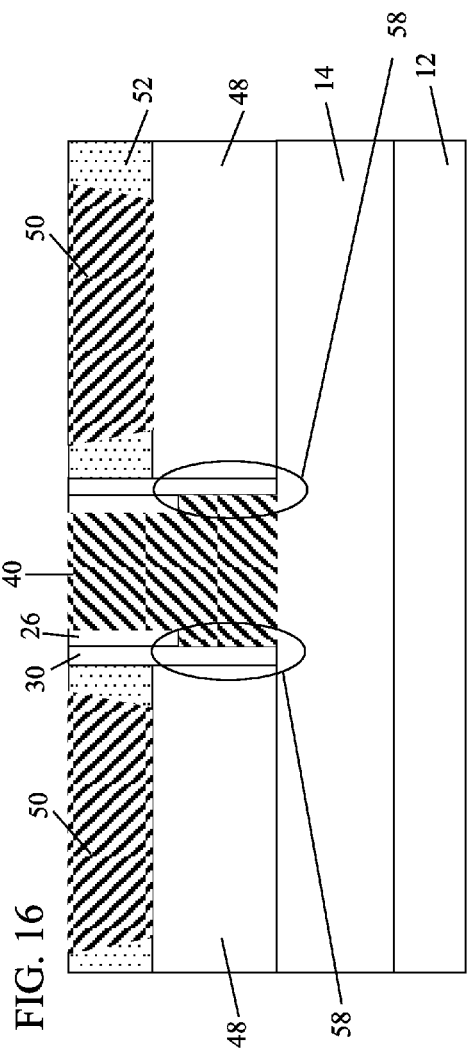

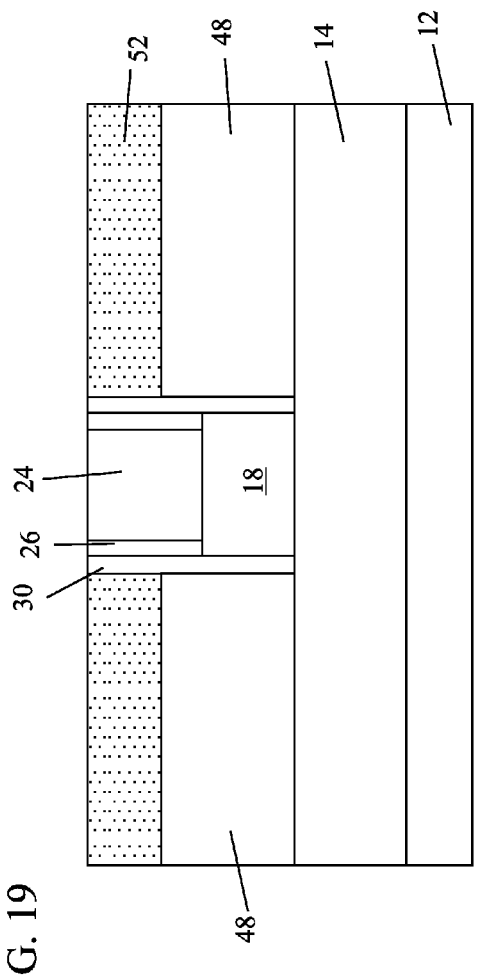
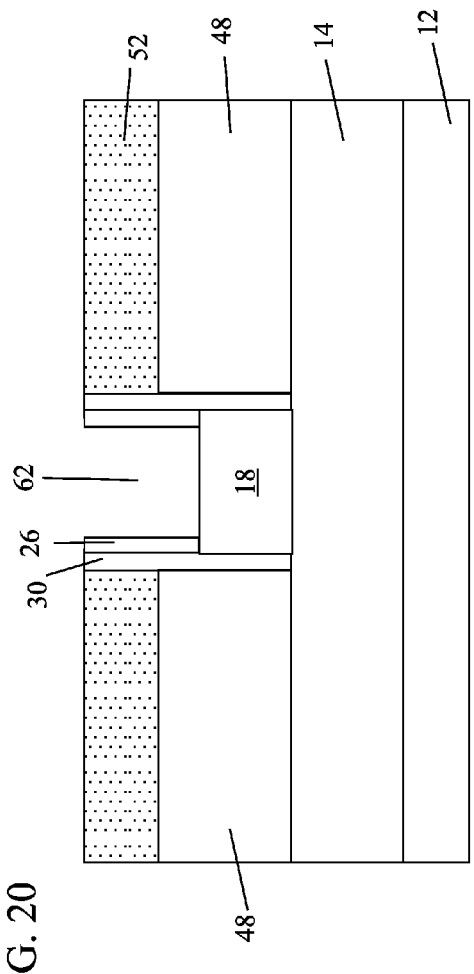
FIG. 19
FIG. 20

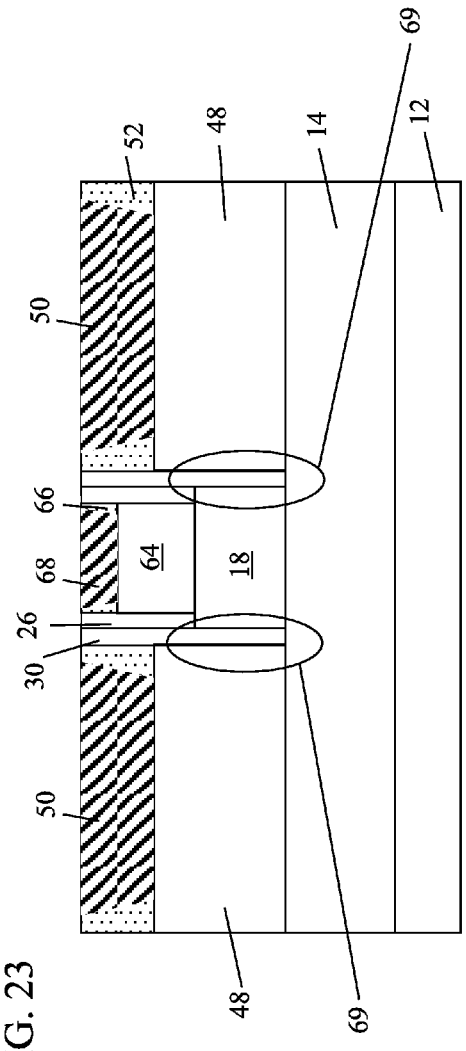
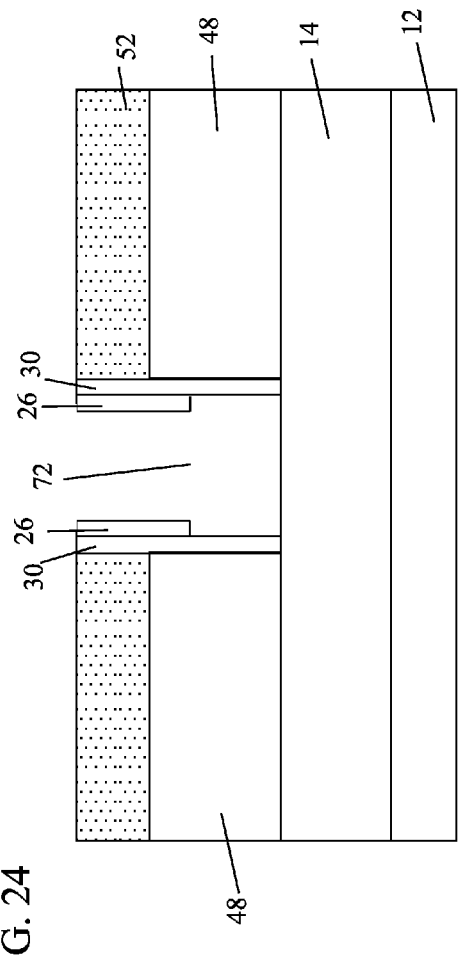

PROGRAMMABLE BULK FINFET ANTIFUSES

BACKGROUND

Technical Field

The present invention generally relates to semiconductor processing, and more particularly to semiconductor devices having programmable antifuse devices.

Description of the Related Art

Fin field effect transistors (FinFETs) are the current state of the art device option for complementary metal oxide semiconductor (CMOS) technology. Technology has begun shifting to bulk FinFETs rather than using FinFETs in silicon-on-insulator (SOI) structures. On-chip antifuses are essential elements for semiconductor chips and are employed in a variety of applications such as system-on-chips. Conventional antifuses are planar and consume valuable real-estate on semiconductor devices.

SUMMARY

In accordance with an embodiment of the present principles, an antifuse device includes a gate structure formed on a substrate including first spacers formed in an upper portion and a conductive material formed in a lower portion below the first spacers. Two conductive regions are disposed adjacent to the gate structure and on opposite sides of the gate structure. A dielectric barrier is formed between the conductive material and each of the conductive regions such that a dual antifuse is formed across the dielectric barrier between the conductive material and the conductive regions on each side of the gate structure.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein:

FIG. 5 is a cross-sectional view of the device of FIG. 4 showing an interlevel dielectric (ILD) formed on the liner formed in accordance with the present principles;

FIG. 6 is a cross-sectional view of the device of FIG. 5 showing the dummy gate removed in accordance with the present principles;

FIG. 7 is a cross-sectional view of the device of FIG. 6 showing the fin removed from a gate structure in accordance with the present principles;

FIG. 8 is a cross-sectional view of the device of FIG. 7 showing lower portions of the liner removed in accordance with the present principles;

FIG. 9 is a cross-sectional view of the device of FIG. 8 showing a high-k dielectric formed in the gate structure in accordance with the present principles;

FIG. 10 is a cross-sectional view of the device of FIG. 9 showing a gate conductor formed on the high-k dielectric in the gate structure in accordance with the present principles;

FIG. 11 is a cross-sectional view of the device of FIG. 10 showing the ILD removed to form trenches in accordance with the present principles;

FIG. 12 is a cross-sectional view of the device of FIG. 11 showing contacts formed in the trenches to form antifuse devices in accordance with the present principles;

FIG. 15 is a cross-sectional view of the device of FIG. 14 showing contacts formed in trenches to form antifuse devices with a liner in accordance with the present principles;

FIG. 16 is a cross-sectional view of a device having S/D regions formed instead of contacts and contacts formed on top of the S/D regions to form antifuse devices with a liner in accordance with the present principles;

FIG. 19 is a cross-sectional view of the device of FIG. 18 having an ILD formed on the S/D regions in accordance with the present principles;

FIG. 20 is a cross-sectional view of the device of FIG. 19 having a dummy gate removed in accordance with the present principles;

FIG. 23 is a cross-sectional view of the device of FIG. 22 having contacts and a gate contact formed on the epitaxially grown region to form antifuse devices in accordance with the present principles;

FIG. 24 is a cross-sectional view of a device having S/D regions, an ILD and a recess formed in a gate structure in accordance with the present principles;

DETAILED DESCRIPTION

Figure 1:
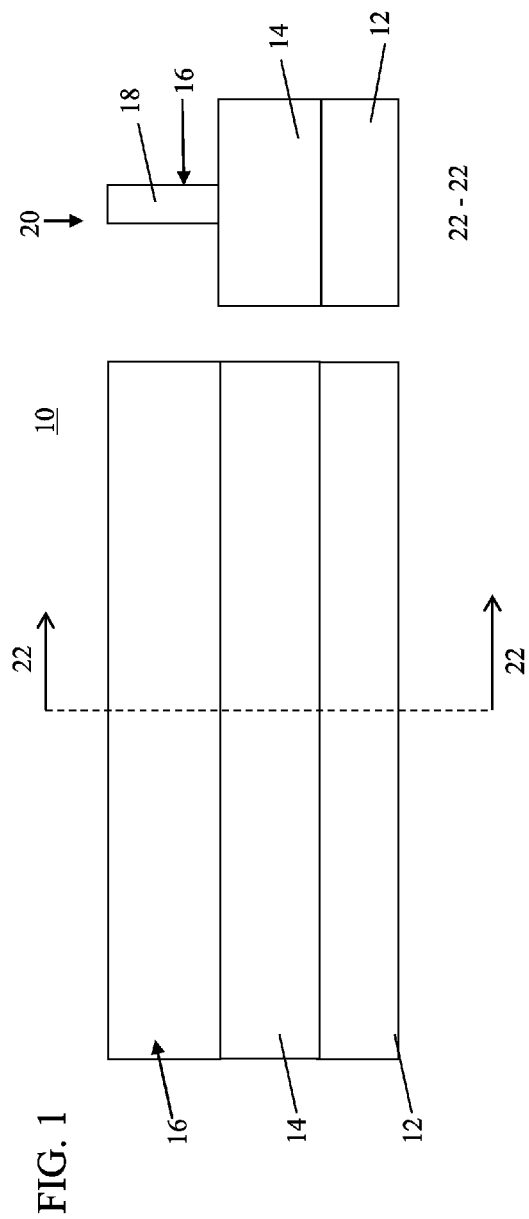
FIG. 1 is a cross-sectional view showing a bulk substrate with a punch through stopper and a fin formed thereon, and a cross-sectional view taken at section line 22-22 in accordance with the present principles.

In accordance with the present principles, devices and methods for forming programmable antifuses or dual antifuses are provided. The devices include structures that are fully compatible with bulk fin field effect transistor (FinFET) complementary metal oxide semiconductor (CMOS) process flow. In particularly useful embodiments, the antifuses or dual antifuses are formed using existing gate regions and designs. In one embodiment, a punch through stop layer of a bulk substrate design may instead employ a buried dielectric layer of a semiconductor-on-insulator (SeOI or SOI) substrate to make the present principles applicable to SOI FinFETs.

The present principles may include a full metal FinFET antifuse with a replacement metal gate flow process with or without a high-k gate dielectric, which may be employed with bulk and/or SOI substrates. In other embodiments, bulk FinFET antifuses may be formed with source/drain epitaxial regions with or without high-k gate dielectric gate process flows. Other embodiments may include source/drain epitaxial regions and a diffused epitaxial gate terminal.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a substrate 12 may be a bulk semiconductor or a base semiconductor of a semiconductor (or silicon)-on-insulator (SeOI or SOI) substrate. An intermittent layer 14 is provided on the substrate 12 and may include a punch through stopper layer for a bulk substrate or a buried dielectric layer for a SOI substrate. The substrate 12 may be crystalline, semi-crystalline, microcrystalline, or amorphous. The substrate may be (i.e., except for contaminants) a single element (e.g., silicon), primarily (i.e., with doping) of a single element, for example, silicon (Si) or germanium (Ge), or the substrate may include a compound, for example, $Al_2O_3$, $SiO_2$, GaAs, SiC, or SiGe. The substrate 12 may also have multiple material layers. In some examples, a semiconductor-on-insulator substrate (SeOI), a silicon-on-insulator substrate (SOI), germanium-on-insulator substrate (GeOI), or silicon-germanium-on-insulator substrate (SGOI) may be employed. In various embodiments, the substrate 12 may be a single crystal silicon (Si), silicon germanium (SiGe), or III-V semiconductor (e.g., GaAs) wafer, or have a single crystal silicon (Si), silicon germanium (SiGe), or III-V semiconductor (e.g., GaAs) surface/active layer.

A semiconductor layer 16 may be formed from the substrate 12 (in bulk substrate embodiments) or may be a semiconductor layer of the SOI substrate. The semiconductor layer 16 may be a single crystal silicon (Si), silicon germanium (SiGe), or III-V semiconductor (e.g., GaAs) wafer. The semiconductor layer 16 preferably includes a Si based material.

The semiconductor layer 16 is patterned into fins 18, which is depicted along a longitudinal line in view 20 of FIG. 1. View 20 shows a cross-section taken along section line 22-22. The fins 18 are formed by etching the semiconductor layer 16 (and/or the substrate 12) in accordance with a fin template layer or mask (not shown). In various embodiments, the fin template layer masks the substrate during transfer of a fin pattern to the substrate 12 or semiconductor layer 16 to form a structure 10 of FIG. 1. The fin template layer may include a resist pattern or sacrificial mandrels are a spacer image transfer (SIT) process. In other embodiments, the fins 18 may be grown on the substrate 12 or the punch through stopper layer 16 by an epitaxial growth process.

In one embodiment where a bulk substrate is employed, the punch through stopper layer 14 includes a doped layer of substrate 12. The doped punch through stopper layer 14 may include a dopant concentration of between about $1 \times 10^{17}$ to about $1 \times 10^{20}$ and preferably about $5 \times 10^{18}$ atoms/cc. Other dopant concentrations may be employed.

Figure 2:
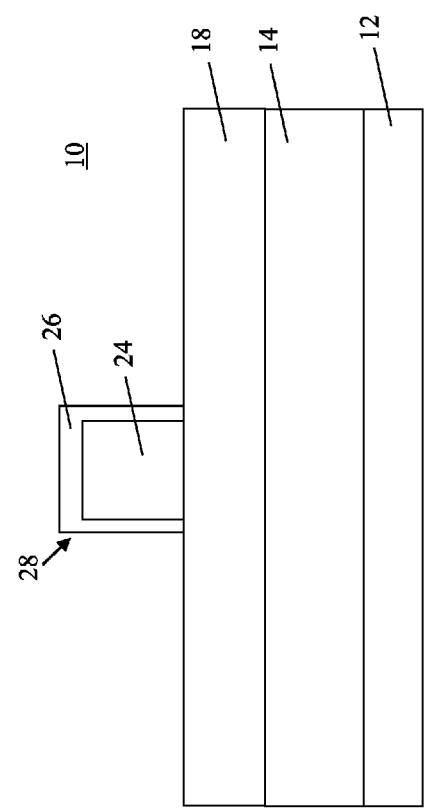
FIG. 2 is a cross-sectional view of a device of FIG. 1 showing a spacer layer formed on the dummy gate in accordance with the present principles.

Referring to FIG. 2, a dummy gate structure 28 is formed on and over the fin 18. In one embodiment, the dummy gate structure 28 includes a dummy gate material 24 and a spacer layer 26. The dummy gate material 24 may be formed by blanket depositing dummy gate material 24 to provide a gate stack, wherein the gate stack is patterned and etched to provide the gate structure 28. A pattern is produced by applying a photoresist to the surface to be etched, exposing the photoresist to a pattern of radiation, and then developing the pattern into the photoresist utilizing a resist developer. Once the patterning of the photoresist is completed, the sections covered by the photoresist are protected while the exposed regions are removed using a selective etching process that removes the unprotected regions. The gate structure 28 is formed by a replacement gate method. In a replacement gate process sequence, the dummy gate material 24 may be composed of a semiconductor material, such as amorphous silicon or polysilicon. Later in the process sequence, the dummy gate material is removed, and replaced with a functional gate structure having at least a gate dielectric and the at least one gate conductor. In some instances, in the replacement gate method, the functional gate structure may be formed after source and drain regions have been processed. In other embodiments, a gate first approach may be employed, where a gate dielectric and a gate conductor are patterned initially and remain throughout the other processing.

The spacer layer 26 may be formed in direct contact with the gate structure 28. The spacer layer 26 may be formed by depositing a conformal layer of dielectric material, such as oxides, nitrides or oxynitrides, on the dummy gate material 24 or the gate structure 28 followed by an etch process that removes the conformal layer from all of the surfaces of the fins 18 except for the sidewalls and top, which are protected during the etch.

Figure 3:
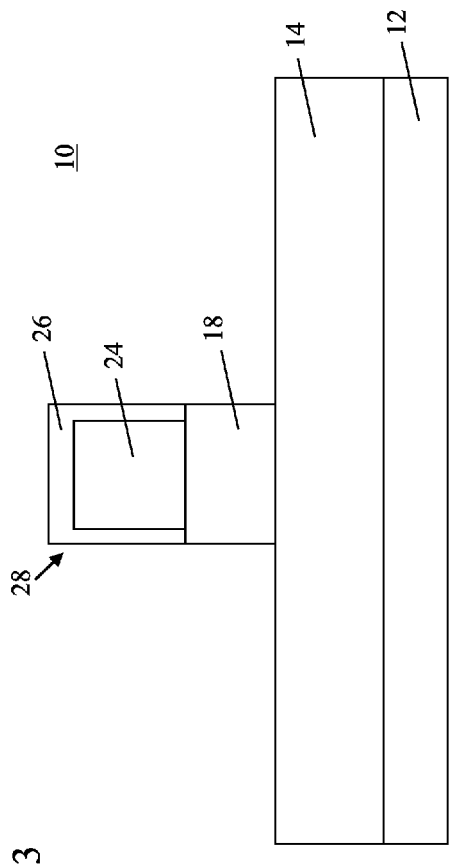
FIG. 3 is a cross-sectional view of the device of FIG. 2 showing the spacer layer employed as an etch mask to etch the fin in accordance with the present principles.

Referring to FIG. 3, an anisotropic selective etch (e.g., a reactive ion etch (RIE)) is performed to recess the fins 18 in accordance with the gate structure 28. The spacer 26 may include a silicon nitride, although other materials may be employed. The etch removes portions of the fin 18 not protected by the spacer layer 26 on the gate structure 28. The fin 18 is recessed down to the punch through stopper layer 14 (or dielectric layer for SOI substrates).

Figure 4:
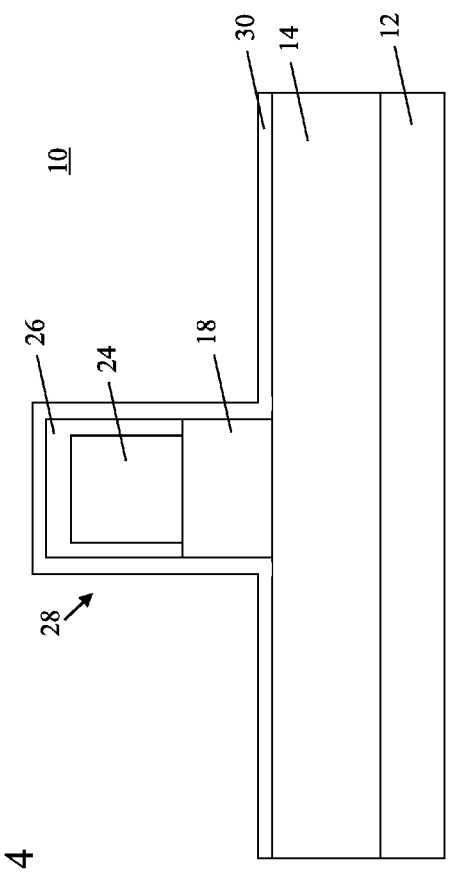
FIG. 4 is a cross-sectional view of the device of FIG. 3 showing a liner formed on the spacer layer and the punch stopper layer in accordance with the present principles.

Referring to FIG. 4, a liner layer 30 is formed over the gate structure 28, fin 18 and the punch through stopper layer 14. The liner layer 30 may include a conductive material or a dielectric material. In one embodiment, the liner 30 includes TiN, TaN, or similar materials. The liner layer 30 includes a dielectric material for many of the embodiments described herein, e.g., SiN or other nitride.

Referring to FIG. 5, a dielectric material is deposited over the device 10 and is planarized down to the dummy gate material 24 to form an interlevel dielectric (ILD) layer 32. The ILD layer 32 may be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™ other carbon containing materials, organo-inorganic materials such as spin-on glasses and silsesquioxane-based materials, and diamond-like carbon (DLC), also known as amorphous hydrogenated carbon, α-C:H). Additional choices for the ILD layer 32 include any of the aforementioned materials in porous form, or in a form that changes during processing to or from being porous and/or permeable to being non-porous and/or non-permeable.

The planarization of the top surface of the device 10 may be performed using a chemical mechanical polish (CMP) although etching processes may also be employed in addition to or instead of the CMP process. Other CMOS processing steps may be employed depending on the design and type of devices being fabricated.

Referring to FIG. 6, the dummy gate material 24 is removed from the gate structure 28 to expose the fin 18. The dummy gate material 24 is selectively etched relative to the ILD layer 32, the spacers 26 and the liner 30. The selective etch to remove the dummy gate material 24 may include a dry or wet etch. The selective etch forms an opening 34.

Referring to FIG. 7, the fin 18 is removed from the gate structure 28 to expose the punch through stopper layer 14. The fin 18 is selectively etched relative to the ILD layer 32, the spacers 26 and the liner 30. The selective etch is performed through the opening 34. The selective etch to remove the fin 18 may include a dry or wet etch.

Referring to FIG. 8, in another etch process, portions of the liner 30 are removed from a lower portion 36 of the recess 34. The portions 36 that are exposed (not protected by the spacers 26) are removed by a selective etch. The portions 36 are selectively etched relative to the ILD layer 32, the spacers 26 and the punch through stopper layer 14. The selective etch is performed through the opening 34. The selective etch to remove the portions 36 may include a dry or wet etch.

Referring to FIG. 9, in one embodiment, a gate dielectric 38 is formed by a conformal deposition process, e.g., a chemical vapor deposition (CVD), atomic layer deposition (ALD), etc. The gate dielectric 38 may be in addition to a native oxide that forms on the punch through stopper layer 14. The gate dielectric 38 may be composed of a high-k dielectric layer, i.e., a dielectric having a dielectric constant that is greater than 4.0, as measured at room temperature. Such high dielectric constant materials may include, but are not limited to, hafnium oxides, hafnium silicates, titanium oxides, barium-strontium-titantates (BSTs) and lead-zirconate-titanates (PZTs). In one embodiment, the gate dielectric 38 has a thickness ranging from about 10 angstroms to about 200 angstroms. After deposition of the gate dielectric 38, a planarization process (e.g., CMP) is performed to remove access materials from a top surface of the ILD layer 32.

Referring to FIG. 10, a gate conductor 40 is formed by a deposit process, e.g., CVD, ALD, sputtering, etc. The gate conductor 40 may be composed of conductive materials including, but not limited to metals, metal alloys, metal nitrides and metal silicides, as well as laminates thereof and composites thereof. In one embodiment, the gate conductor 40 may be any conductive metal including, but not limited to W, Ni, Ti, Mo, Ta, Cu, Pt, Ag, Au, Ru, Ir, Rh, and Re, and alloys that include at least one of the aforementioned conductive elemental metals. The gate conductor 40 may also comprise doped polysilicon and/or polysilicon-germanium alloy materials (e.g., having a dopant concentration from $1\times10^{18}$ dopant atoms per cubic centimeter to $1\times10^{22}$ dopant atoms per cubic centimeter) and polycide materials (doped polysilicon/metal silicide stack materials). After deposition of the gate conductor 40, a planarization process (e.g., CMP) is performed to remove access materials from a top surface of the ILD layer 32. In one embodiment, the CMP may be performed on both the gate dielectric 38 and the gate conductor 40 in a single CMP process.

Referring to FIG. 11, trenches 42 are formed adjacent to the gate structure 28. The trenches 42 may be etched in accordance with a mask or patterned resist, or a self-aligned etch (e.g., to etch ILD 32 in exposed areas) may be employed depending on the device design. The etch exposes the liner 30.

Referring to FIG. 12, contacts 44 are formed in the trenches 42 by depositing any suitable conductive material. The deposition process may include barrier layers (not shown) conformally deposited prior to deposition of the contact materials. The contacts 44 may be deposited by any suitable process, such as, e.g., CVD, ALD, sputtering, etc. After the deposition process is complete, a planarization process may be performed, such as, e.g., CMP to planarize a top surface of the conductive material, remove access materials and form the contacts 44.

Contacts 44 may include any suitable conductive material, such as polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition.

An antifuse 46 is formed between the contact 44 and the gate conductor 40. Since there are two sides of the gate conductor 40 and two contacts 44, two antifuses are provided, hence dual antifuses. The dielectric layer 38 (and liner 30) provide electrical isolation between the contacts 44 and the substrate (punch through layer 14). The antifuse 46 starts with a high resistance and is designed to permanently create an electrically conductive path when a voltage across the antifuse exceeds a certain level. The dielectric layer 38 includes a very thin dielectric barrier between a pair of contacts 44 and gate conductor 40. Formation of a conductive channel is performed by a dielectric breakdown, e.g., forced by a high voltage pulse. The antifuses 46 are fabricated in accordance with CMOS fabrication processes. The antifuses 46 may be activated on one side of the gate conductor 40 or both sides of the gate conductor 40 as needed.

Figures 13, 14:
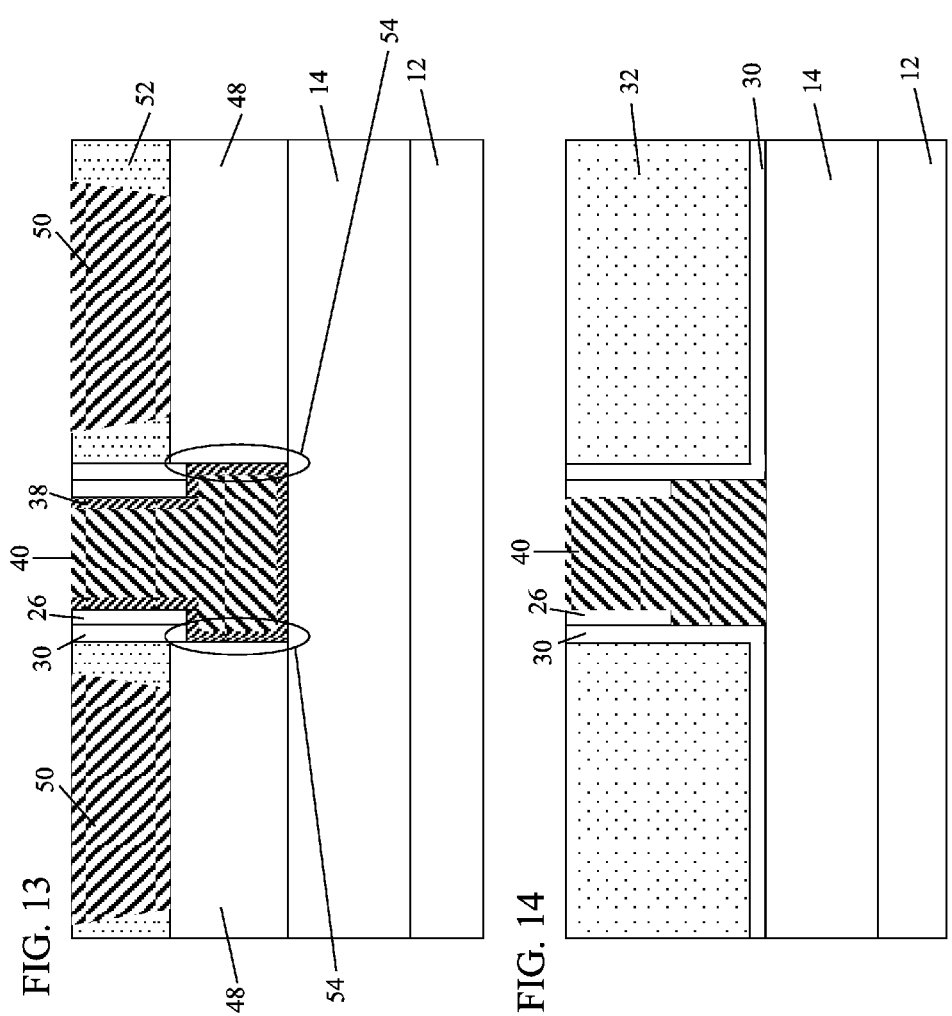
FIG. 13 is a cross-sectional view of a device having source and drain (S/D) regions formed instead of contacts and contacts formed on top of the S/D regions to form antifuse devices in accordance with the present principles.
FIG. 14 is a cross-sectional view of a device showing a gate conductor formed in contact with a liner in the gate structure in accordance with the present principles.

Referring to FIG. 13, an alternate embodiment includes source and drain (S/D) regions 48 formed on top of the punch through stopper layer 14. In one embodiment, the liner 30 is removed from the punch through stopper layer 14 by a reactive ion etch (RIE) process. Then, S/D regions 48 are formed on the punch through stopper layer 14.

The S/D regions 48 may be formed by epitaxy that can be done by ultrahigh vacuum chemical vapor deposition (UHVCVD), rapid thermal chemical vapor deposition (RTCVD), metalorganic chemical vapor deposition (MOCVD), low-pressure chemical vapor deposition (LP-CVD), limited reaction processing CVD (LRPCVD), molecular beam epitaxy (MBE). Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium (SiGe), and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

After formation of the S/D regions 48, a dielectric layer (e.g., ILD) 52 is formed and patterned to create contact openings. Contacts 50 are deposited and planarized as previously described. Contacts 50 and contacts 44 may include the same materials and formed using similar processing.

An antifuse 54 is formed between the S/D regions 48 and the gate conductor 40. Since there are two sides of the gate conductor 40 and two S/D regions 48, two antifuses are provided, hence dual antifuses. The antifuse 54 can be shorted against the S/D region 48 on either side or both by permanently creating an electrically conductive path when a voltage across the antifuse exceeds a certain level. The dielectric layer 38 includes a very thin dielectric barrier between S/D regions 48 and gate conductor 40. Formation of a conductive channel is performed by a dielectric breakdown, e.g., forced by a high voltage pulse. The antifuses 54 are fabricated in accordance with CMOS fabrication processes. The antifuses 54 may be activated on one side of the gate conductor 40 or both sides of the gate conductor 40, as needed.

Referring to FIG. 14, beginning with FIG. 7, instead of removing portions 36 of the liner 30 (FIG. 8), the gate conductor 40 is formed in contact with the liner 30. The liner 30 includes a dielectric layer (e.g., an oxide, a nitride, an oxynitride, etc.).

Referring to FIG. 15, contacts 44 are formed. An antifuse 56 is formed between the contacts 44 and the gate conductor 40 with the liner 30 therebetween. Since there are two sides of the gate conductor 40 and two contacts 44, two antifuses are provided, hence dual antifuses. The antifuse 56 can be shorted against the contacts 44 on either side or both by permanently creating an electrically conductive path when a voltage across the antifuse exceeds a certain level. The dielectric layer 30 includes a very thin dielectric barrier between the contact(s) 44 and gate conductor 40. Formation of a conductive channel is performed by a dielectric breakdown, e.g., forced by a high voltage pulse. The antifuses 56 are fabricated in accordance with CMOS fabrication processes. The antifuses 56 may be activated on one side of the gate conductor 40 or both sides of the gate conductor 40, as needed.

Referring to FIG. 16, an alternate embodiment includes S/D regions 48 formed on top of the punch through stopper layer 14 as in FIG. 13. In this embodiment, the liner 30 is removed from the punch through stopper layer 14 by a RIE process. Then, S/D regions 48 are formed on the punch through stopper layer 14.

After formation of the S/D regions 48, the dielectric layer (e.g., ILD) 52 is formed and patterned to create contact openings. Contacts 50 are deposited and planarized as previously described. The gate conductor 40 is formed in contact with the liner 30. The liner 30 includes a dielectric layer (e.g., an oxide, a nitride, an oxynitride, etc.).

An antifuse 58 is formed between the contacts 50 and the gate conductor 40 with the liner 30 therebetween. Since there are two sides of the gate conductor 40 and two contacts 50, two antifuses are provided, hence dual antifuses. The antifuse 58 can be shorted against the contacts 50 on either side or both by permanently creating an electrically conductive path when a voltage across the antifuse exceeds a certain level. The dielectric layer 30 includes a very thin dielectric barrier between the contact(s) 50 and gate conductor 40. Formation of a conductive channel is performed by a dielectric breakdown, e.g., forced by a high voltage pulse. The antifuses 58 are fabricated in accordance with CMOS fabrication processes. The antifuses 58 may be activated on one side of the gate conductor 40 or both sides of the gate conductor 40, as needed.

Figure 17:
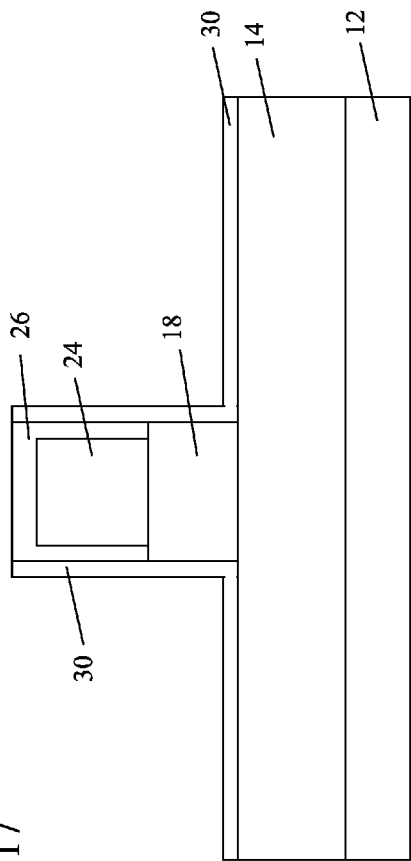
FIG. 17 is a cross-sectional view of a device having a gate structure with a second set of spacers in accordance with the present principles.

Referring to FIG. 17, in another embodiment, the punch through layer 14 and spacer 26 are exposed on horizontal surfaces by removing the liner 30. The liner 30 may be removed from horizontal surfaces by RIE processing. This leaves the liner 30 on sidewalls of the spacer layer 26 (in the dummy gate 24 region) and fin 18 to form a second spacer. The liner 30 may include a dielectric material in this embodiment.

Figure 18:
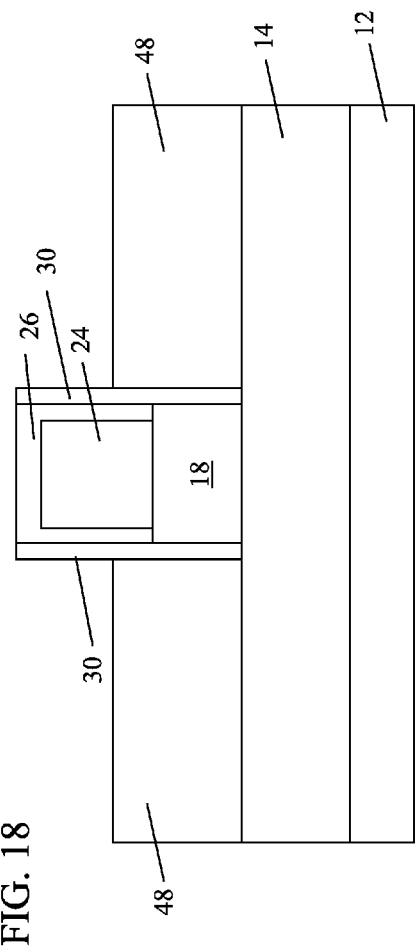
FIG. 18 is a cross-sectional view of the device of FIG. 17 having S/D regions formed on opposite sides of a gate structure in accordance with the present principles.

Referring to FIG. 18, S/D regions 48 are formed on top of the punch through stopper layer 14 on opposite sides of the fin 18. The S/D regions 48 may be formed as before by, e.g., an epitaxial growth process. In one embodiment, the S/D regions 48 are in-situ doped (e.g., 35-50% Ge for SiGe S/D regions, for PFETs or doped Si S/D regions for NFETs).

Referring to FIG. 19, ILD layer 52 is deposited over the S/D regions 48. The ILD 52 is planarized by, e.g., CMP or etching. The planarization process removes a horizontal portion of the spacer layer 26 to expose the dummy gate 24 (in a gate last design).

Referring to FIG. 20, the dummy gate 24 is removed to expose the fin 18 and form a recess 62. The dummy gate 24 may be removed by a selective etch process.

Figure 21:
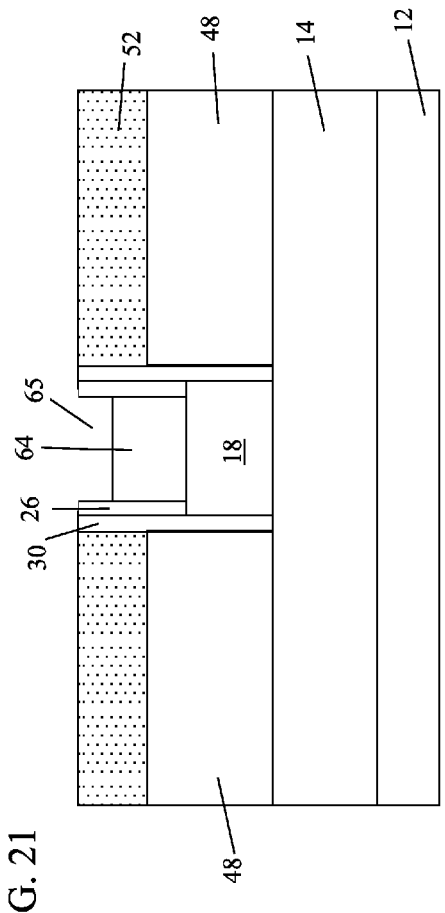
FIG. 21 is a cross-sectional view of the device of FIG. 20 having an epitaxially grown region formed on a fin in the gate structure in accordance with the present principles.

Referring to FIG. 21, a region 64 is grown on the fin 18 in a similar process for the formation of S/D regions 48. The region 64 may include in-situ doped SiGe:B for PFETs and in-situ doped Si for NFETs. The region 64 may be formed as before by, e.g., an epitaxial growth process. The growth process for region 64 is terminated to leave a recess 65 above the region 64.

Figure 22:
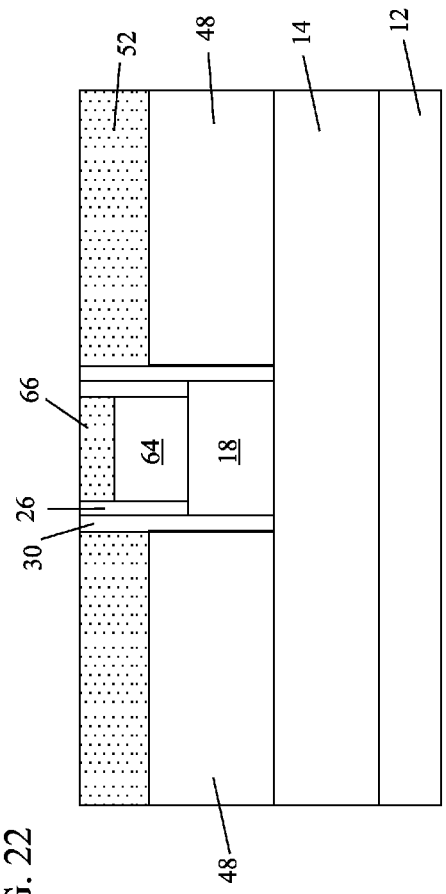
FIG. 22 is a cross-sectional view of the device of FIG. 21 having an ILD formed on the epitaxially grown region in accordance with the present principles.

Referring to FIG. 22, a dielectric material 66 is deposited or grown to fill recess 65. The dielectric material may include an oxide or other material. In one embodiment, the dielectric material 66 includes a same material as the ILD layer 52. An anneal process may be performed to diffuse and activate dopants in one or more of the fin 18, region 64 and S/D regions 48. Any known anneal process may be performed.

Referring to FIG. 23, a gate contact 68 and contacts 50 are formed by etching/patterning contact holes and depositing material by a same deposition process, e.g., CVD, ALD, sputtering, etc. After deposition, the gate contact 68 and the contacts 50 undergo a planarization process (e.g., CMP) to remove access materials from a top surface of the ILD layer 52 and the dielectric material 66. An antifuse 69 is formed between the S/D regions 48 and the fin 18 with the liner 30 therebetween. Since there are two sides of the fin 18 and two S/D regions 48, two antifuses 69 are provided, hence dual antifuses. The antifuse 69 can be shorted against the S/D regions 48 on either side or both by permanently creating an electrically conductive path when a voltage across the antifuse exceeds a certain level. The dielectric layer 30 includes a very thin dielectric barrier between the S/D regions 48 and fin 18. Formation of a conductive channel is performed by a dielectric breakdown, e.g., forced by a high voltage pulse. The antifuses 69 are fabricated in accordance with CMOS fabrication processes. The antifuses 69 may be activated on one side of the fin 18 or both sides of the fin 18, as needed.

Referring to FIG. 24, in another embodiment including S/D regions 48, the dummy gate 24 and the fin 18 are removed to form a recess 72. The recess 72 is lined by liner 30 and includes spacers 26. The recess 72 exposes the punch through stopper layer 14 therebelow. The ILD layer 52 is formed on the S/D regions 48.

Figure 25:
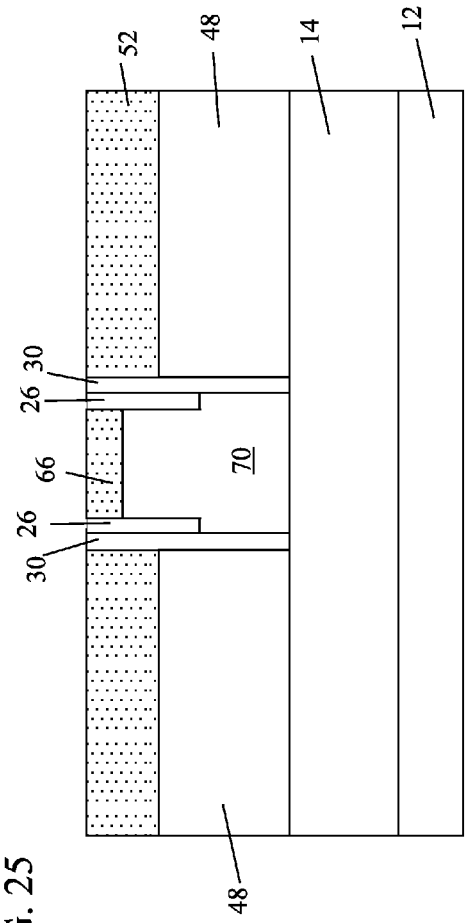
FIG. 25 is a cross-sectional view of the device of FIG. 24 having the ILD formed over an epitaxially grown region from a punch through stopper layer in accordance with the present principles.

Referring to FIG. 25, a region 70 is grown on the punch through stopper layer 14 in a similar process for the formation of S/D regions 48. The region 70 may include in-situ doped SiGe:B for PFETs and in-situ doped Si for NFETs. The region 64 may be formed as before by, e.g., an epitaxial growth process. The growth process for region 70 is terminated to leave a recess above the region 70. The recess is filled with dielectric material 66 and planarized.

Figure 26:
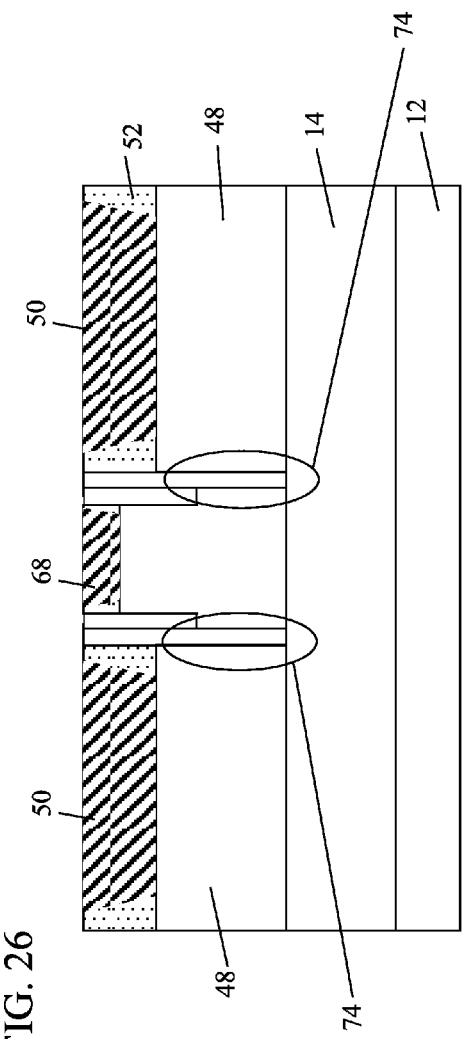
FIG. 26 is a cross-sectional view of the device of FIG. 25 having contacts and a gate contact formed on the epitaxially grown region to form antifuse devices in accordance with the present principles.

Referring to FIG. 26, in a gate contact 68 and contacts 50 are formed by etching/patterning contact holes and depositing material by a same deposition process, e.g., CVD, ALD, sputtering, etc. After deposition, the gate contact 68 and the contacts 50 undergo a planarization process (e.g., CMP) to remove access materials from a top surface of the ILD layer 52 and the dielectric material 66. An antifuse 74 is formed between the S/D regions 48 and the region 70 with the liner 30 therebetween. Since there are two sides of the region 70 and two S/D regions 48, two antifuses 74 are provided, hence dual antifuses. The antifuse 74 can be shorted against the S/D regions 48 on either side or both by permanently creating an electrically conductive path when a voltage across the antifuse exceeds a certain level. The dielectric layer 30 includes a very thin dielectric barrier between the S/D regions 48 and region 70. Formation of a conductive channel is performed by a dielectric breakdown, e.g., forced by a high voltage pulse. The antifuses 74 are fabricated in accordance with CMOS fabrication processes. The antifuses 74 may be activated on one side of the region 70 or both sides of the region 70, as needed.

It should be understood that the antifuses described herein provide a vertically disposed antifuse. The vertical orientation of the antifuse reduces layout area (footprint) for the antifuse structures. In addition, each gat structure provides dual antifuses to further reduce layout area.

Figure 27:
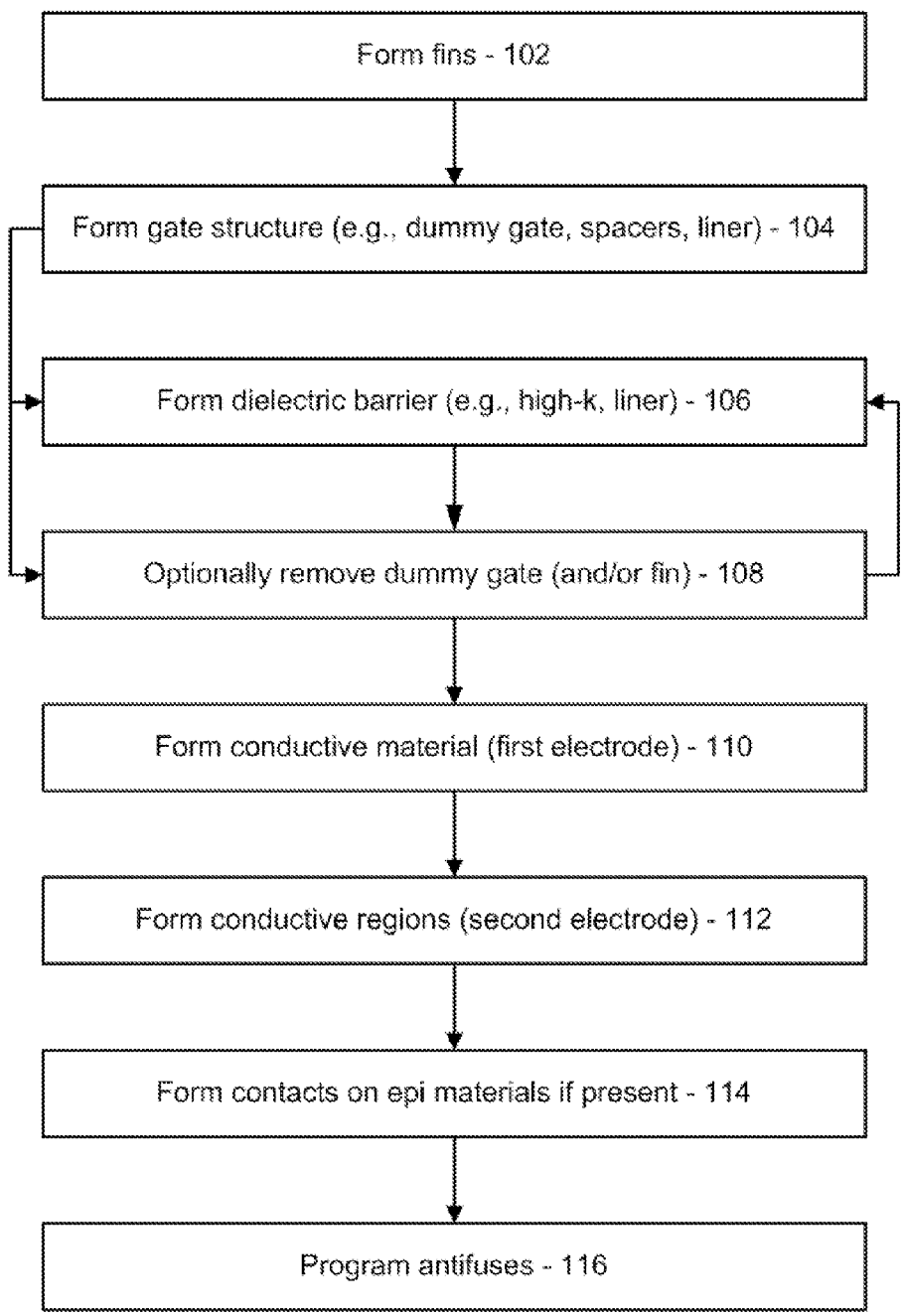
FIG. 27 is a block/flow diagram showing a method for forming an antifuse device using complementary metal oxide semiconductor (CMOS) processing in accordance with the present principles.

Referring to FIG. 27, methods for forming an antifuse device using complementary metal oxide semiconductor (CMOS) processing are illustratively shown. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, fins are formed on a substrate. The fins may be formed on a punch through stopper layer or on a buried dielectric layer depending on the type of substrate employed and the antifuse design. The substrate may include a bulk substrate or a semiconductor-on-insulator substrate. In block 104, a gate structure is formed on a fin including a patterned dummy gate, and first spacers are formed in an upper portion of the gat structure by forming a spacer layer over the dummy gate. In block 106, a dielectric barrier is formed in a lower portion of the gate structure (below the first spacers). The dielectric barrier may include a high dielectric constant (high-k) layer formed over the first spacers and surrounding a conductive material on the gate structure (once the gate conductor is formed). A liner may also be employed with or without the high-k dielectric. The liner may be formed over the gate structure and the regions on opposite sides of the gates structure.

In block 108, a dummy gate and/or the fin may be removed from the gate structure depending on the embodiment. Depending on the design, the dielectric barrier may be formed before or after the dummy gate and/or the fin are removed. In block 110, a conductive material is formed in the lower portion of the gate structure below the first spacers. The conductive material may include a metal (gate conductor) formed in the gate structure or may include an epitaxially deposited/grown semiconductor material formed in the gate structure (e.g., doped in-situ and annealed to diffuse and activate the dopants). The gate conductor (conductive material) forms a first electrode of the antifuse device. In one embodiment, the conductive material may include a fin structure disposed in the gate structure the fin being formed on a punch through stopper. The conductive material includes an epitaxially deposited semiconductor material formed on the fin between the first spacers in the gate structure.

In block 112, two conductive regions disposed adjacent to the gate structure are formed on opposite sides of the gate structure. The conductive regions may include contacts formed in an ILD layer (e.g., on a liner) or may include S/D regions grown on the punch through stopper layer. The conductive regions form second electrodes for a dual antifuse, which is formed across the dielectric barrier between the conductive material and the conductive regions on each side of the gate structure.

In block 114, contacts may be formed on S/D regions and on epitaxially formed conductive material in the gate structure. In block 116, the antifuse or antifuses are programmed by applying a threshold voltage or programming pulse to the gate structures (first electrodes) and/or on the conduction regions. The dielectric barrier breaks down to provide a connection between the gate conductive material and one or two of the conductive regions. Since the device is CMOS compatible, programming the antifuses may be performed by addressing a matrix of devices. When a device is activated it can be programmed to cause a connection through the antifuse or fuses. Other programming methods may be performed.

Having described preferred embodiments for programmable bulk FinFET antifuses (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. An antifuse device, comprising:
a gate structure formed on a substrate including first spacers formed in an upper portion thereof and a conductive material formed in a lower portion, thereof below the first spacers;
two conductive regions disposed adjacent to the gate structure and on opposite sides of the gate structure; and
a dielectric barrier formed between the conductive material and each of the conductive regions such that a dual antifuse is formed across the dielectric barrier between the conductive material and the conductive regions on each side of the gate structure, the dielectric barrier including a high dielectric constant (high-k) layer formed over side surface of the first spacers and surrounding the conductive material on the gate structure.

2. The antifuse device as recited in claim 1, wherein the conductive material includes a metal formed in the gate structure.

3. The antifuse device as recited in claim 1, wherein the conductive material includes an epitaxially deposited semiconductor material formed in the gate structure.

4. The antifuse device as recited in claim 1, wherein the conductive material includes a fin structure disposed in the gate structure, the fin being formed on a punch through stopper.

5. The antifuse device as recited in claim 4, wherein the conductive material further comprises an epitaxially deposited semiconductor material formed on the fin between the first spacers in the gate structure.

6. The antifuse device as recited in claim 1, wherein the conductive regions include contacts formed outside the gate structure.

7. The antifuse device as recited in claim 1, wherein the conductive regions include source and drain regions formed outside the gate structure.

8. The antifuse device as recited in claim 1, wherein the dielectric barrier includes a liner formed on the first spacers and formed between the conductive material and each of the conductive regions.

9. The antifuse device as recited in claim 1, wherein the substrate includes a bulk substrate.

10. The antifuse device as recited in claim 1, wherein the substrate includes a semiconductor-on-insulator substrate.

11. The method device as recited in claim 1, further comprising forming a liner as the dielectric barrier on the first spacers.

12. An antifuse device, comprising:
a substrate;
a punch through stopper layer formed by doping the substrate;
a gate structure formed over the punch through stopper layer including first spacers formed in an upper portion and a conductive material formed in a lower portion below the first spacers, the conductive material extending below the first spacers to form a first antifuse electrode;
two conductive regions disposed adjacent to the gate structure and on opposite sides of the gate structure, the two conductive regions each forming a second antifuse electrode; and
a dielectric barrier formed between the first antifuse electrode and the second antifuse electrodes such that a dual antifuse is formed across the dielectric barrier between the conductive material and the conductive regions on, each side of the gate structure.

13. The antifuse device as recited in claim 12, wherein the dielectric barrier includes a high dielectric constant (high-k) layer formed over the first spacers and surrounding the conductive material on the gate structure.

14. The antifuse device as recited in claim 12, wherein the conductive material includes an epitaxially deposited semiconductor material formed in the gate structure.

15. The antifuse device as recited in claim 12, wherein the conductive material includes a fin structure disposed in the gate structure the fin being formed on the punch through stopper.

16. The antifuse device as recited in claim 15, wherein the conductive material further comprises an epitaxially deposited semiconductor material formed on the fin between the first spacers in the gate structure.

17. The antifuse device as recited in claim 12, wherein the conductive regions include contacts or source and drain regions formed outside the gate structure.

18. The antifuse device as recited in claim 12, wherein the dielectric barrier includes a liner formed on the first spacers and formed between the conductive material and each of the conductive regions.

19. A method for forming an antifuse device using complementary metal oxide semiconductor (CMOS) processing, comprising:
forming a gate structure on a substrate including first spacers formed in an upper portion of the gate structure, a dielectric barrier formed in a lower portion of the gate structure and a conductive material formed in the lower portion of the gate structure below the first spacers, wherein the dielectric barrier includes a high dielectric constant (high-k) layer formed over side surface of the first spacers and surrounding the conductive material on the gate structure; and
forming two conductive regions disposed adjacent to the gate structure and on opposite sides of the gate structure such that a dual antifuse is formed across the dielectric barrier between the conductive material and the conductive regions on each side of the gate structure.

* * * * *